United States Patent
Fujii et al.

(10) Patent No.: US 9,620,704 B2
(45) Date of Patent: Apr. 11, 2017

(54) METHOD FOR ETCHING PIEZOELECTRIC FILM AND METHOD FOR MANUFACTURING PIEZOELECTRIC ELEMENT

(71) Applicant: FUJIFILM Corporation, Tokyo (JP)

(72) Inventors: Takamichi Fujii, Kanagawa (JP); Akihiro Mukaiyama, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/871,339

(22) Filed: Sep. 30, 2015

(65) Prior Publication Data
US 2016/0027996 A1    Jan. 28, 2016

Related U.S. Application Data

(63) Continuation of application No. PCT/JP2014/059123, filed on Mar. 28, 2014.

(30) Foreign Application Priority Data

Apr. 1, 2013    (JP) ................................. 2013-076021

(51) Int. Cl.
*C03C 15/00* (2006.01)
*H01L 41/332* (2013.01)
(Continued)

(52) U.S. Cl.
CPC ........ *H01L 41/332* (2013.01); *H01L 41/0477* (2013.01); *H01L 41/1875* (2013.01); *H01L 41/1876* (2013.01); *H01L 41/29* (2013.01)

(58) Field of Classification Search
CPC ... H01L 41/0477; H01L 41/08; H01L 41/081; H01L 41/083; H01L 41/0805;
(Continued)

(56) References Cited

U.S. PATENT DOCUMENTS

| | | | |
|---|---|---|---|
| 5,868,948 A | 2/1999 | Fujii et al. | |
| 6,798,550 B1 * | 9/2004 | Wang | G02F 1/0311 359/245 |

(Continued)

FOREIGN PATENT DOCUMENTS

| | | | |
|---|---|---|---|
| JP | S63-285011 A | 11/1988 | |
| JP | 3201251 B2 | 8/2001 | |

(Continued)

OTHER PUBLICATIONS

International Preliminary Report on Patentability mailed Oct. 15, 2015 in PCT Application PCT/JP2014/059123, which is related to U.S. Appl. No. 14/871,339.

(Continued)

*Primary Examiner* — Lan Vinh
(74) *Attorney, Agent, or Firm* — Studebaker & Brackett PC

(57) ABSTRACT

In a method for etching a piezoelectric film and a manufacturing method thereof, a piezoelectric film is formed on a substrate on which a lower electrode is formed, a metal film having a thickness of 20 nm to 300 nm is formed, a patterned resist film is formed, the metal film is etched with a first etchant to which the piezoelectric film has etching resistance, and the piezoelectric film is etched with a second etchant to which the metal film has etching resistance.

7 Claims, 9 Drawing Sheets

(51) Int. Cl.
  *H01L 41/29* (2013.01)
  *H01L 41/047* (2006.01)
  *H01L 41/187* (2006.01)

(58) Field of Classification Search
  CPC .......... H01L 21/1875; H01L 21/31111; H01L 21/31122; H01L 41/1876; H01L 21/30604; H01L 21/30608; H01L 21/3061; H01L 21/30607
  USPC .......... 216/83, 101, 103, 105, 108; 438/745, 438/753, 754
  See application file for complete search history.

(56) References Cited

U.S. PATENT DOCUMENTS

| | | | |
|---|---|---|---|
| 8,770,724 B2 * | 7/2014 | Nakayama | B41J 2/14274 347/68 |
| 2007/0115078 A1 * | 5/2007 | Sano | H03H 3/02 333/187 |
| 2010/0147789 A1 | 6/2010 | Kurachi et al. | |
| 2011/0227457 A1 | 9/2011 | Ishikawa et al. | |
| 2011/0228013 A1 * | 9/2011 | Ohashi | B41J 2/14233 347/68 |
| 2013/0112910 A1 | 5/2013 | Noguchi et al. | |
| 2014/0028760 A1 | 1/2014 | Sameshima et al. | |

FOREIGN PATENT DOCUMENTS

| | | |
|---|---|---|
| JP | 2004-031521 A | 1/2004 |
| JP | 2008-192661 A | 8/2008 |
| JP | 2010-147088 A | 7/2010 |
| JP | 4665025 B2 | 4/2011 |
| JP | 2011-122887 A | 9/2011 |
| JP | 2011-192887 A | 9/2011 |
| JP | 2011-199849 A | 10/2011 |
| JP | 2012-244090 A | 12/2012 |
| JP | 2012-253177 A | 12/2012 |
| WO | 2012/057127 A1 | 5/2012 |
| WO | 2012/144305 A1 | 10/2012 |

OTHER PUBLICATIONS

An Office Action; "Notice of Reasons for Refusal," issued by the Japanese Patent Office on May 2, 2016, which corresponds to Japanese Patent Application No. 2013-076021 and is related to U.S. Appl. No. 14/871,339; with English language translation.

International Search Report and Written Opinion from PCT/JP2014/059123 dated Jul. 8, 2014.

* cited by examiner

FIG. 5

| MEASUREMENT POINT | (1) | (2) | (3) | (4) | (5) | AVERAGE |
|---|---|---|---|---|---|---|
| WIDTH ($\mu$m) OF RESIST MASK | 40.08 | 40.08 | 39.89 | 39.98 | 39.99 | 40.004 |
| WIDTH ($\mu$m) OF PIEZOELECTRIC FILM AFTER ETCHING | 38.28 | 38.37 | 38.28 | 38.11 | 38.19 | 38.246 |
| AMOUNT ($\mu$m) OF SIDE ETCHING | 1.8 | 1.71 | 1.61 | 1.87 | 1.8 | 1.758 |

FIG.7

| MEASUREMENT POINT | (1) | (2) | (3) | (4) | (5) | AVERAGE |
|---|---|---|---|---|---|---|
| WIDTH ($\mu$m) OF RESIST MASK | 40.35 | 39.9 | 39.45 | 39.9 | 39.45 | 39.81 |
| WIDTH ($\mu$m) OF PIEZOELECTRIC FILM AFTER ETCHING | 26.75 | 23.58 | 24.49 | 24.47 | 24.95 | 24.848 |
| AMOUNT ($\mu$m) OF SIDE ETCHING | 13.6 | 16.32 | 14.96 | 15.43 | 14.5 | 14.962 |

FIG. 8

| | METAL FILM | FIRST ETCHANT | PIEZOELECTRIC FILM | SECOND ETCHANT | EVALUATION | COMMENT |
|---|---|---|---|---|---|---|
| EXAMPLE 1 | NiCr | CERIC AMMONIUM NITRATE-BASED | PZT | HYDROFLUORIC ACID-BASED | A | FAVORABLE |
| EXAMPLE 2 | NiCr | CERIC AMMONIUM NITRATE-BASED | BaTiO₃ | HYDROFLUORIC ACID-BASED | A | FAVORABLE |
| EXAMPLE 3 | Au | IODINE-BASED | PZT | HYDROFLUORIC ACID-BASED | A | FAVORABLE |
| EXAMPLE 4 | Ni | HYDROGEN PEROXIDE SOLUTION+PHOSPHORIC ACID | PZT | HYDROFLUORIC ACID-BASED | A | FAVORABLE |
| EXAMPLE 5 | SUS | FERRIC CHLORIDE | PZT | HYDROFLUORIC ACID-BASED | A | FAVORABLE |
| EXAMPLE 6 | Cr | NITRIC ACID-BASED | PZT | HYDROFLUORIC ACID-BASED | A | FAVORABLE |
| EXAMPLE 7 | AlN | POTASSIUM HYDROXIDE(KOH) | PZT | HYDROFLUORIC ACID-BASED | A | FAVORABLE |
| COMPARATIVE EXAMPLE 1 | NONE | NONE | PZT | HYDROFLUORIC ACID-BASED | C | PZT OVER-ETCHED |
| COMPARATIVE EXAMPLE 2 | TiO₂ | HYDROFLUORIC ACID-BASED | PZT | HYDROFLUORIC ACID-BASED | C | PZT DAMAGED |
| COMPARATIVE EXAMPLE 3 | NiCr | HYDROFLUORIC ACID-BASED | PZT | HYDROFLUORIC ACID-BASED | C | NiCr FILM NOT ETCHED |

FIG. 9

| | METAL FILM | THICKNESS (nm) OF METAL FILM | PIEZOELECTRIC FILM | THICKNESS (μm) OF PIEZOELECTRIC FILM | EVALUATION | COMMENT |
|---|---|---|---|---|---|---|
| COMPARATIVE EXAMPLE 4 | NiCr | 10 | PZT | 3 | C | NiCr FILM NOT SUFFICIENT AS MASK |
| EXAMPLE 8 | NiCr | 20 | PZT | 3 | A | FAVORABLE |
| EXAMPLE 9 | NiCr | 200 | PZT | 3 | A | FAVORABLE |
| EXAMPLE 10 | NiCr | 300 | PZT | 3 | B | SMALL AMOUNT OF SIDE-ETCHING OCCURRED |
| COMPARATIVE EXAMPLE 5 | NiCr | 400 | PZT | 3 | C | NiCr FILM OVER-ETCHED, AND SHAPE CHANGED |

METHOD FOR ETCHING PIEZOELECTRIC FILM AND METHOD FOR MANUFACTURING PIEZOELECTRIC ELEMENT

CROSS-REFERENCE TO RELATED APPLICATIONS

The present application is a Continuation of PCT International Application No. PCT/JP2014/059123 filed on Mar. 28, 2014 claiming priority under 35 U.S.C §119(a) to Japanese Patent Application No. 2013-076021 filed on Apr. 1, 2013. Each of the above applications is hereby expressly incorporated by reference, in their entirety, into the present application.

BACKGROUND OF THE INVENTION

1. Field of the Invention

The present invention relates to a method for etching a piezoelectric film and a method for manufacturing a piezoelectric element and, in particular, relates to a method for etching a piezoelectric film and a method for manufacturing a piezoelectric element, in which the etching is performed by wet etching.

2. Description of the Related Art

A piezoelectric element formed of a piezoelectric material which expands and contracts in response to an increase and decrease in electric field application intensity is used as an actuator, a sensor, a recording element, or the like which is mounted in an ink jet recording head. As a method for forming a pattern of a piezoelectric material, a wet etching process using an etchant is used.

For example, JP4665025B describes, as a method for processing an epitaxially grown PZT film, an etching method using at least one of hydrochloric acid and nitric acid and at least one fluorine compound of ammonium fluoride and hydrogen fluoride. JP3201251B describes a technique of patterning a dielectric through two steps of: etching a dielectric with an etchant which is composed of hydrofluoric acid and sulfuric acid or hydrochloric acid; and removing a residual portion with a post-treatment solution which is composed of acids. By etching a dielectric through the two steps, the selectivity with a photoresist can be improved.

In addition, JP2004-031521A describes a technique of performing patterning using an etchant containing one of hydrogen fluoride (HF), buffered hydrofluoric acid (BHF), diluted hydrofluoric acid (DHF), sulfuric acid ($H_2SO_4$), hydrochloric acid (HCl), and nitric acid ($HNO_3$). JP1988-285011A (JP-S63-285011A) describes a method in which, in order to etch a metal film on a piezoelectric substrate material with high accuracy, the metal film is dry-etched in an initial stage and then a final residual portion is wet-etched. JP2012-244090A describes a technique of using a chromium film as a mask for the wet etching of a piezoelectric film.

SUMMARY OF THE INVENTION

Dry etching which is generally used is a method capable of high-accuracy etching. However, since an expensive apparatus and a long period of time are required for the dry etching, the cost is high. Therefore, a wet etching method for performing patterning with higher accuracy is required.

The etching method described in JP4665025B has a problem in that a residue remains during etching in a non-epitaxial PZT film in which a noble metal electrode is formed on a Si substrate or in a non-epitaxial PZT film to which Nb is added. In addition, the adhesion between a resist and PZT is poor, the side etching of a PZT film progresses, and the PZT film becomes tapered. In JP3201251B, the etching is performed through the two steps, and thus there is a problem in that the process is complicated. In addition, in this etching method, there is a problem in the adhesion between a resist and PZT, and side etching is likely to progress. Further, since the etching time increases, the degree of side etching increases. In JP2004-031521A, unless a combination of the composition of the etchant with the structure of the piezoelectric material is optimized, there is a problem in that a residue remains and side etching also progresses.

In addition, the method described in JP1988-285011A (JP-S63-285011A) is a method for patterning an electrode with high accuracy, and the etching of a piezoelectric material is not assumed. In JP2012-244090A, since the metal film used as the mask is patterned using a lift-off method, there is a problem in that, for example, the etching accuracy is poor or a peeled material causes contamination.

The present invention has been made in consideration of the above-described circumstances, and an object thereof is to provide a method for etching a piezoelectric film and a method for manufacturing a piezoelectric element, which are capable of suppressing side etching during the wet etching of a piezoelectric film and forming a piezoelectric film with high pattern accuracy.

In order to achieve the above-described object, according to the present invention, there is provided a method for etching a piezoelectric film including: a piezoelectric film forming step of forming a piezoelectric film on a lower electrode formed on a substrate; a metal film forming step of forming a metal film having a thickness of 20 nm to 300 nm on the piezoelectric film; a resist film forming step of forming a resist film on the metal film and patterning the resist film; a metal film etching step of etching the metal film with a first etchant by using the resist film as a mask material; and a piezoelectric film etching step of etching the piezoelectric film with a second etchant by using the metal film after the metal film etching step as a mask material, in which as the first etchant, an etchant to which the piezoelectric film has etching resistance is used, and as the second etchant, an etchant to which the metal film has etching resistance is used.

According to the present invention, the metal film is provided between the piezoelectric film and the resist film, and the piezoelectric film is etched by using the metal film as a mask material. Therefore, as compared to a case where a resist film of the related art is used as a mask material, a difference in thermal expansion coefficient between the piezoelectric film and the mask material can be reduced. Accordingly, during the etching of the piezoelectric film, the peeling of the metal film as the mask material can be prevented. Therefore, the side etching of the piezoelectric film can be prevented, and the pattern accuracy can be improved.

In addition, there is a large difference in thermal expansion coefficient between the resist film and the metal film; however, since the metal film has a small thickness of 20 nm to 300 nm, the etching of the metal film can be completed before side etching occurs in the metal film. Accordingly, the metal film can be patterned on the resist film as a mask material with high accuracy.

In addition, during the etching of the metal film, an etchant, which etches the metal film and has resistance to the piezoelectric film, is used; and during the etching of the piezoelectric film, an etchant, which etches the piezoelectric film and has resistance to the metal film, is used. As a result, only the target film can be etched and can be patterned along a pattern of the resist film with high accuracy.

In the method for etching a piezoelectric film according to an aspect of the present invention, it is preferable that the metal film is made of a material containing one of Fe, Cr, Ni, NiCr, Steel Use Stainless (SUS), Al, Cu, and Au.

In the method for etching a piezoelectric film according to the above-described aspect of the present invention, the metal film is made of a material containing the above-described metal; as a result, the adhesion between the metal film and the piezoelectric film can be improved. Accordingly, during the etching of the piezoelectric film, the peeling of the metal film can be prevented, and thus the progress of side etching of the piezoelectric film can be suppressed.

In the method for etching a piezoelectric film according to another aspect of the present invention, it is preferable that the metal film contains oxygen or nitrogen.

In the method for etching a piezoelectric film according to the above-described aspect of the present invention, the metal film contains oxygen or nitrogen; as a result, the adhesion between the metal film and the piezoelectric film can be improved, and peeling during etching can be prevented. Accordingly, the progress of side etching can be suppressed.

In the method for etching a piezoelectric film according to still another aspect of the present invention, it is preferable that the first etchant contains one of ferric chloride (iron chloride (III)), hydrochloric acid, sulfuric acid, ammonium persulfate, a mixed liquid of iodine and alkali iodide, sulfuric acid, ceric ammonium nitrate, a mixed liquid of hydrogen peroxide solution and phosphoric acid, nitric acid, and potassium hydroxide.

In the method for etching a piezoelectric film according to the above-described aspect of the present invention, an etchant containing the above-described solution can be used as the first etchant which etches the metal film and has etching resistance to the piezoelectric film.

In the method for etching a piezoelectric film according to still another aspect of the present invention, it is preferable that the second etchant is a hydrofluoric acid-based etchant.

In the method for etching a piezoelectric film according to the above-described aspect of the present invention, a hydrofluoric acid-based etchant is used as the second etchant which etches the piezoelectric film and has etching resistance to the metal film; as a result, only the piezoelectric film can be etched without the metal film being etched, and the side etching of the piezoelectric film can be suppressed.

In the method for etching a piezoelectric film according to still another aspect of the present invention, it is preferable that the piezoelectric film is made of an oxide material.

In the method for etching a piezoelectric film according to the above-described aspect of the present invention, the piezoelectric film is made of an oxide material; as a result, piezoelectric performance can be improved.

In the method for etching a piezoelectric film according to still another aspect of the present invention, it is preferable that the piezoelectric film has a perovskite structure containing Pb.

In the method for etching a piezoelectric film according to the above-described aspect of the present invention, the piezoelectric film has a perovskite structure containing Pb; as a result, piezoelectric characteristics can be improved.

In the method for etching a piezoelectric film according to still another aspect of the present invention, it is preferable that the piezoelectric film is represented by the following Formula (P).

$$A_a B_b O_3 \quad (P)$$

(In the formula, A represents an A-site element which contains at least one element containing Pb as a major component, B represents a B-site element which contains at least one element selected from the group consisting of Ti, Zr, V, Nb, Ta, Cr, Mo, W, Mn, Sc, Co, Cu, In, Sn, Ga, Zn, Cd, Fe, and Ni, O represents oxygen, and although a=1.0 and b=1.0 is standard, numerical values of a and b may deviate from 1.0 within a range where a perovskite structure can be adopted.)

In the method for etching a piezoelectric film according to the above-described aspect of the present invention, the composition of the piezoelectric film is represented by Formula (P); as a result, piezoelectric performance can be improved.

In order to achieve the above-described object, according to the present invention, there is provided a method for manufacturing a piezoelectric element including: a lower electrode forming step of forming the lower electrode on the substrate; a piezoelectric film forming step of forming a piezoelectric film on the lower electrode using the above-described method for etching a piezoelectric film; and a resist film removing step of removing the resist film.

According to the present invention, the piezoelectric film can be patterned with high accuracy and thus can be used as a piezoelectric element. In addition, the metal film which is used as a mask material remains without being removed and is used as an upper electrode. As a result, the formation of an upper electrode is not necessary, and the number of manufacturing steps can be reduced.

It is preferable that the method for manufacturing a piezoelectric element according to another aspect of the present invention includes: a metal film removing step of removing the metal film after the resist film removing step; and an upper electrode forming step of forming an upper electrode on the piezoelectric film from which the metal film is removed.

In the method for manufacturing a piezoelectric element according to the above-described aspect of the present invention, the metal film is removed, and the upper electrode is separately formed; as a result, a piezoelectric element can be formed.

In the method for manufacturing a piezoelectric element according to still another aspect of the present invention, it is preferable that two or more of the metal films are formed; in the metal film etching step, different etchants are used for the respective metal films as the first etchant; and each of the etchants which are used as the first etchant etches one of the metal films and has etching resistance to any other one of the metal films.

In the method for manufacturing a piezoelectric element according to the above-described aspect of the present invention, in a case where the metal film is used as an upper electrode, when conductivity is insufficient with only the metal film as a mask material and is further required, two or more metal films including a conductive metal film can be formed. As a result, the metal film which is used as a mask material can be used as an upper electrode, a metal film removing step and an upper electrode forming step are not necessary.

By using the method for etching a piezoelectric film and the method for manufacturing a piezoelectric element according to the present invention, side etching can be suppressed during wet etching, and a satisfactory pattern can be formed on a pattern of a resist mask with high accuracy.

BRIEF DESCRIPTION OF THE DRAWINGS

FIG. 5 is a table showing the results of Example 1 of Test Example 1.

FIG. 7 is a table showing the results of Comparative Example 1 of Test Example 1.

FIG. 8 is a table showing the results of Test Example 2.

FIG. 9 is a table showing the results of Test Example 3.

DESCRIPTION OF THE PREFERRED EMBODIMENTS

Hereinafter, preferable embodiments of a method for etching a piezoelectric film and a method for manufacturing a piezoelectric element according to the present invention will be described with reference to the accompanying drawings.

Method for Manufacturing Piezoelectric Element

First Embodiment

Figure 1:
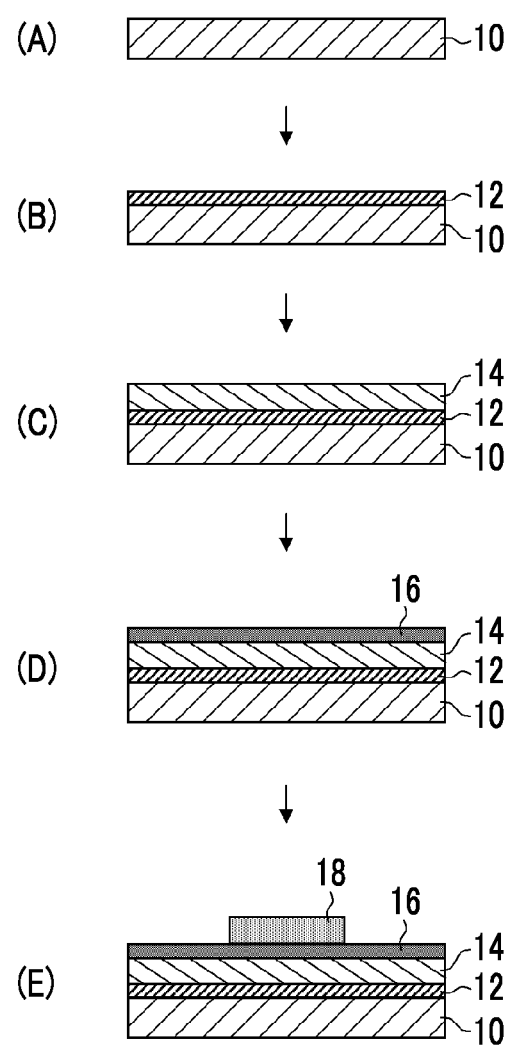
FIG. 1 is a diagram showing manufacturing steps of a piezoelectric element according to a first embodiment.
Figure 2:
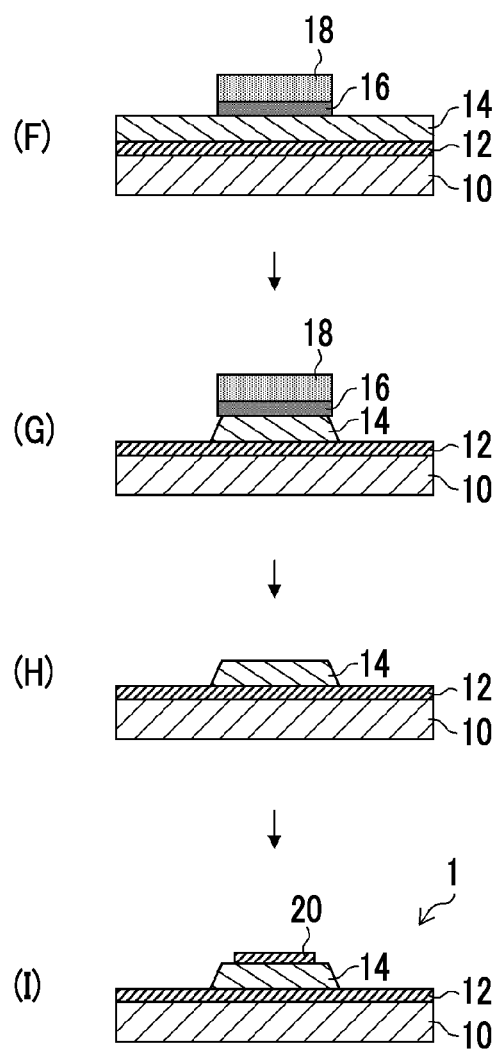
FIG. 2 is a diagram showing manufacturing steps of the piezoelectric element according to the first embodiment.

First, a method for manufacturing a piezoelectric element will be described. FIGS. 1 and 2 are diagrams showing manufacturing steps of a piezoelectric element.

(Step 1: Substrate Preparation Step)

First, as shown in (A) of FIG. 1, a substrate 10 is prepared.

The substrate 10 is not particularly limited, and examples thereof include substrates formed of silicon, glass, stainless steel (SUS), yttrium-stabilized zirconia (YSZ), $SrTiO_3$, alumina, sapphire, silicon carbide, and the like. The substrate 10 may be a laminated substrate such as a silicon on insulator (SOI) substrate in which a $SiO_2$ film and a Si active layer are sequentially laminated on a silicon substrate. In addition, for example, a buffer layer for improving lattice matching properties or an adhesion layer for improving adhesion between the electrode and the substrate may be provided between the substrate 10 and the lower electrode 12.

(Step 2): Lower Electrode Forming Step

Next, a lower electrode 12 is formed on the substrate 10 (B of FIG. 1). A method for forming the lower electrode 12 is not particularly limited, and examples thereof include: a vapor phase epitaxial method using plasma such as a sputtering method, an ion plating method, a plasma CVD (chemical vapor deposition) method, or a pulsed laser deposition (PLD) method; an ion beam sputtering method; and a vapor deposition method.

A major component of the lower electrode 12 is not particularly limited, and examples thereof include platinum-based metals such as ruthenium (Ru), rhodium (Rh), palladium (Pd), osmium (Os), iridium (Ir), and platinum (Pt); metal oxides; and combinations thereof. By using these materials for the lower electrode 12, piezoelectric performance can be improved. The thickness of the lower electrode 12 is not particularly limited and is preferably 50 nm to 500 nm.

(Step 3): Piezoelectric Film Forming Step

Next, a piezoelectric film 14 is formed on the lower electrode 12 ((C) of FIG. 1). A method for forming the piezoelectric film 14 is not particularly limited, and examples thereof include: a vapor phase epitaxial method using plasma such as a sputtering method, an ion plating method, a plasma CVD method, or a pulsed laser deposition (PLD) method; and an ion beam sputtering method.

<Piezoelectric Film Material>

The piezoelectric film 14 is formed of one or plural perovskite type oxides represented by the following formula (P). It is preferable that a B-site element B contains Ti and Zr. In addition, it is preferable that an A-site element contains at least one metal element selected from the group consisting of Bi, Sr, Ba, Ca, and La.

$$A_a B_b O_3 \qquad (P)$$

(In the formula, A represents an A-site element which contains at least one element containing Pb as a major component, B represents a B-site element which contains at least one element selected from the group consisting of Ti, Zr, V, Nb, Ta, Cr, Mo, W, Mn, Sc, Co, Cu, In, Sn, Ga, Zn, Cd, Fe, and Ni, O represents oxygen, and although a=1.0 and b=1.0 is standard, numerical values of a and b may deviate from 1.0 within a range where a perovskite structure can be adopted.)

Examples of the perovskite type oxide represented by Formula (P) include lead titanate, lead zirconate titanate (PZT), lead zirconate, lead lanthanum titanate, lead lanthanum zirconate titanate, lead magnesium niobate-lead zirconate titanate, and lead nickel niobate-lead zirconate titanate. The piezoelectric film 14 may be the mixed crystal system of perovskite type oxides represented by Formula (P).

In particular, piezoelectric performance can be improved by the B site containing Nb. The Nb content is preferably 3 at % to 30 at %. When the Nb content is lower than 3 at %, an effect of Nb addition cannot be obtained. In addition, a non-piezoelectric heterogeneous phase called a pyrochlore phase is likely to be formed due to the Nb addition, and when the Nb content is higher than 30 at %, a large amount of the pyrochlore phase is formed and largely affects piezoelectric performance, which is not preferable.

By adding Nb to the piezoelectric film 14 as a component, a pyrochlore phase is likely to be formed. However, by using an etchant described below, a pyrochlore phase that is difficult to etch in the related can be etched. As a result, the piezoelectric film 14 can be etched without any residue remaining.

In addition, it is preferable that the piezoelectric film 14 is a columnar-structure film including plural columnar crystals which extend in a direction non-parallel to the substrate surface because high piezoelectric performance can be obtained. In the film structure including plural columnar crystals which extend in the direction non-parallel to the substrate surface, an oriented film with an aligned crystal orientation can be obtained. This film structure can be obtained by forming a film through a non-thermal equilibrium process such as a sputtering method. A growth direction of columnar crystals is not particularly limited as long as it is non-parallel to the substrate surface, and may be a substantially vertical direction or an oblique direction. The average column diameter of plural columnar crystals forming the piezoelectric film is not particularly limited and is preferably 30 nm to 1 μm. In addition, by forming the piezoelectric film using a vapor phase epitaxial method such as a sputtering method, the film surface can be made to be smooth. Therefore, the piezoelectric film can be suitably etched. In addition, since the piezoelectric film has surface smoothness, fine patterning can be performed.

The crystal structure of the piezoelectric film 14 is not particularly limited, and examples thereof include a tetragonal system, a rhombohedral system, and a mixed crystal system thereof in a PZT system. For example, in the case of $Pb(Zr_{0.52}Ti_{0.48})O_3$ having a morphotropic phase boundary (MPB) composition, a single-crystal tetragonal structure, a mixed crystal structure of a tetragonal structure and a rhombohedral structure, or a single-crystal rhombohedral structure may be obtained depending on film formation conditions.

<Other Piezoelectric Film Materials>

In addition to the piezoelectric material represented by Formula (P), a barium titanate-based piezoelectric material can be used as the material of the piezoelectric film 14. For example, a KNN (($K_{0.5}Na_{0.5}$)$NbO_3$)-based material or a BNT (($Bi_{0.5}Na_{0.5}$)$TiO_3$)-based material which is generally disclosed as a non-lead piezoelectric material can also be used.

The thickness of the piezoelectric film 14 is not particularly limited as long as a desired displacement can be obtained, and is preferably 500 nm or more and more preferably 2 μm to 5 μm.

(Step 4): Metal Film Forming Step

A metal film 16 is formed on the entire surface of the formed piezoelectric film 14 ((D) of FIG. 1.). A method for forming the metal film 16 is not particularly limited, and examples thereof include a vapor phase epitaxial method using plasma such as a sputtering method, an ion plating method, a plasma CVD method, or a pulsed laser deposition (PLD) method; and an ion beam sputtering method.

It is preferable that the material for forming the metal film 16 is a material having superior adhesion with the piezoelectric film 14 (for example, lead zirconate titanate (PZT)). In addition, since the metal film 16 and the piezoelectric film 14 are patterned by wet etching in the subsequent steps, it is necessary that the metal film 16 has resistance to an etchant of the piezoelectric film 14.

Specifically, as the metal, for example, Au, Ni, NiCr, Fe, Steel Use Stainless (SUS), or Al can be used. In addition, in order to improve the adhesion with the piezoelectric film 14, the metal film 16 formed of the above-described material may contain oxygen or nitrogen.

The thickness of the metal film 16 is preferably 300 nm or less and more preferably 200 nm or less. When the thickness of the metal film 16 is large, side etching occurs in the metal film 16 and the pattern shape is poor during the wet etching of the metal film 16. In addition, when the thickness of the metal film 16 is less than 20 nm, the metal film 16 is insufficient as a mask material, which is not preferable.

(Step 5): Resist Film Forming Step

After the formation of the metal film 16, a resist is applied to the metal film 16 and is patterned. After being formed using a spin coating method or the like, the resist undergoes soft baking, exposure, development, and post baking. Instead of post baking, a curing treatment (UV curing) using ultraviolet irradiation may be performed. In this way, the resist film 18 which is used as a mask material during the patterning of the metal film 16 is patterned ((E) of FIG. 1).

(Step 6): Metal Film Etching Step

After the formation of the resist film 18, the metal film 16 is wet-etched by using the resist film 18 as a mask material ((F) of FIG. 2)).

As a first etchant which is used for the wet etching of the metal film 16, an etchant to which the piezoelectric film 14 has etching resistance is used. "Having etching resistance" implies that a material is not substantially etched and, when being observed by visual inspection after etching, is not modified without the progress of etching. In the piezoelectric film 14 and the metal film 16, it is preferable that a selection ratio (piezoelectric film:metal film) of the etchant used for the etching of the metal film 16 is ideally 0:100. For example, the selection ratio (piezoelectric film:metal film) of the etchant used for the etching of the metal film 16 is practically 1:100 and more preferably 0.1:100. It is necessary that an etchant having the above-described selection ratio and combination is used as the first etchant.

As the first etchant used for the etching of the metal film 16, an etchant containing one of the following elements as a major component can be used, the elements including one of ferric chloride (iron chloride (III)), hydrochloric acid, sulfuric acid, ammonium persulfate, a mixed liquid of iodine and alkali iodide, nitric acid, ceric ammonium nitrate, a mixed liquid of hydrogen peroxide solution and phosphoric acid, and potassium hydroxide.

A wet etching method is not particularly limited and may be, for example, a spray method, or an impregnation method (impregnation in a bath).

(Step 7): Piezoelectric Film Etching Step

Next, the piezoelectric film 14 is wet-etched by using the metal film 16 as a mask material ((G) of FIG. 2).

As a second etchant which is used as the etchant of the piezoelectric film 14, an etchant, which etches the piezoelectric film 14 and has etching resistance to the metal film 16, is used. "Having etching resistance" implies that a material is not substantially etched and, when being observed by visual inspection after etching, is not modified without the progress of etching. In the metal film 16 and the piezoelectric film 14, it is preferable that a selection ratio (metal film:piezoelectric film) of the etchant used for the etching of the piezoelectric film 14 is ideally 0:100. For example, the selection ratio (metal film:piezoelectric film) of the etchant used for the etching of the piezoelectric film 14 is practically 1:100 and more preferably 0.1:100.

[Etchant of Piezoelectric Film (Second Etchant)]

As the second etchant used for the etching of the piezoelectric film 14, an etchant containing at least a fluorine-based chemical solution and nitric acid can be used. In addition, when a resist material having hydrochloric acid resistance is used, the second etchant may contain hydrochloric acid. For example, an etchant containing the following components (1) to (7) can be used.

(1) Fluorine-Based Chemical Solution

A fluorine-based chemical solution such as a buffered hydrofluoric acid (BHF; for example, ammonium fluoride ($NH_4F$) or ammonium hydrogen fluoride ($NH_4F.HF$)), hydrofluoric acid (HF), or a diluted hydrofluoric acid (DHF) can favorably dissolve the material of the piezoelectric film such as PZT and a metal oxide thereof. The total concentration of the fluorine-based chemical solution is preferably 0.1% to 5% with respect to the total weight of the etchant. When the concentration is low, etching performance deteriorates. When the concentration is high, there is a problem in that the resist material is damaged.

(2) Nitric Acid

By using nitric acid, etching can be performed while oxidizing the metal. Therefore, by mixing nitric acid with the fluorine-based chemical solution, an etching effect can be improved. In particular, for example, a produced metal fluoride (such as lead fluoride) can be favorably etched using the fluorine-based etchant.

In particular, nitric acid has an effect of etching lead fluoride and lead chloride. Accordingly, when etching is performed using the fluorine-based chemical solution and a chemical solution described below containing hydrochloric acid, lead fluoride or lead chloride is produced; however, lead fluoride or lead chloride can be etched with nitric acid.

The concentration of nitric acid is preferably 5% to 40% with respect to the total weight of the etchant. When the concentration of nitric acid is low at 5% or lower, a residue remains, which is not preferable. When the concentration is high, the resist is damaged and over-etched, which is not preferable.

(3) Hydrochloric Acid

By using hydrochloric acid, etching can be performed while oxidizing the metal. Therefore, by mixing hydrochloric acid with the fluorine-based chemical solution, an etching effect can be improved. In particular, for example, a produced metal fluoride (such as lead fluoride) can be favorably etched using the fluorine-based etchant. However, when PZT is etched with the chemical solution containing hydrochloric acid, HCl reacts with Cl and Pb to produce lead chloride, and etching does not progress. Accordingly, the lower the amount of HCL, the better.

The amount of HCl is preferably less than 10% and more preferably 5% or less with respect to the total weight of the etchant. When the amount of HCl is 10% or more, the production of a chloride (in the case of a PZT film, lead chloride) is predominant, and it is difficult to perform etching. It can be verified by an experiment that etching can be favorably performed by controlling the amount of HCl to be less than 10%. Deterioration in etching performance caused by reducing the amount of hydrochloric acid can be handled by increasing the amount of nitric acid.

Ratio of Hydrochloric Acid to Nitric Acid

A ratio (weight; hydrochloric acid/nitric acid) of hydrochloric acid to nitric acid is preferably 1/4 or lower and more preferably 3/28. By controlling the amount of nitric acid to be more than the amount of hydrochloric acid, lead chloride produced due to a reaction between hydrochloric acid and PZT can be removed by nitric acid. Therefore, etching can be performed without any residue remaining (4) Acetic Acid Acetic acid has the same effect as nitric acid or hydrochloric acid. In addition, by controlling the etching rate and using acetic acid in combination with nitric acid, the etching of a residue can be promoted. The concentration of acetic acid is preferably 0% to 30% with respect to the total weight of the etchant. The addition of a large amount of acetic acid may weaken the effects of other solutions. Therefore, it is preferable that an appropriate amount of acetic acid is added.

(5) Sulfuric Acid

Sulfuric acid is used for the etching of a metal material and for the etching of an oxide of Ti and enables etching to be favorably performed in terms of etching performance to a PZT film. However, when the amount of sulfuric acid is excessively large, the resist material is dissolved. Therefore, it is necessary that the addition amount is adjusted.

The concentration of sulfuric acid is preferably 0% to 20% with respect to the total weight of the etchant.

(6) Water

Water can be used to adjust the concentration of the above-described chemical solutions.

(7) Other Components

Within a range where the object of the present invention is not impaired, other components, for example, a surfactant or a deterioration inhibitor can be optionally mixed into the second etchant.

[Other Etchants]

In addition, the piezoelectric film 14 can be etched by using, as an etchant, a mixed liquid of hydrogen chloride (hydrochloric acid), ammonium fluoride, and water among the above-described components.

A wet etching method of the piezoelectric film 14 is not particularly limited and may be, for example, a spray method, or an impregnation method (impregnation into a bus).

(Step 8): Resist Film Removing Step

Next, the resist film 18 is peeled off. The resist film 18 can be peeled off using a special peeling solution.

(Step 9): Metal Film Removing Step

Next, the metal film 16 is peeled off ((H) of FIG. 2). The metal film 16 can be peeled off using the etchant used in the metal film etching step.

(Step 10): Upper Electrode Forming Step

An upper electrode 20 is formed on the piezoelectric film 14 from which the metal film 16 is peeled off ((I) of FIG. 2). As a result, a piezoelectric element 1 is formed. A method for forming the upper electrode 20 is not particularly limited, and examples thereof include a vapor phase epitaxial method using plasma such as a sputtering method, an ion plating method, a plasma CVD method, or a pulsed laser deposition (PLD) method; and an ion beam sputtering method.

A major component of the upper electrode 20 is not particularly limited, and examples thereof include the exemplary materials of the lower electrode 12; electrode materials which are used in a general semiconductor process such as Al, Ta, Cr, Cu, Au, or NiCr; and combinations thereof. The thickness of the upper electrode 20 is not particularly limited and is preferably 50 nm to 500 nm.

<Action>

Figure 3:
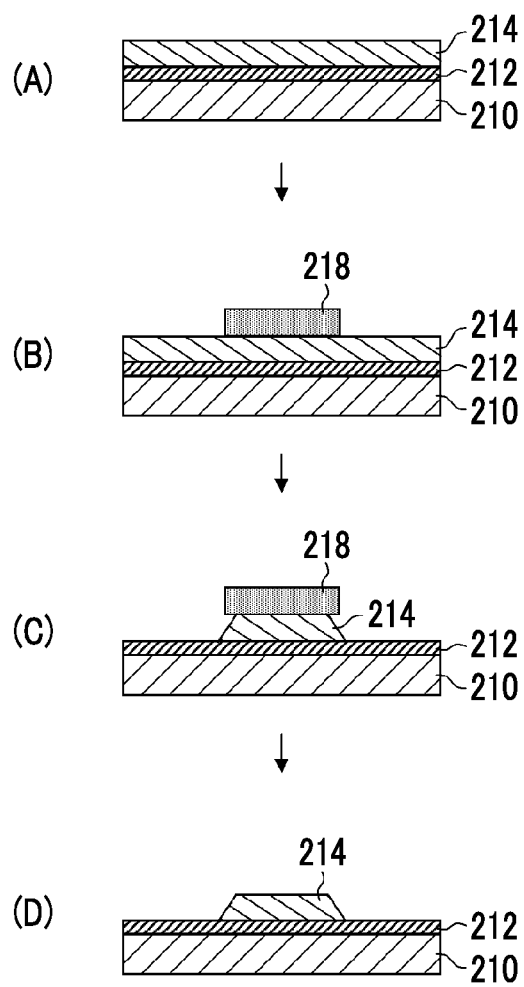
FIG. 3 is a diagram showing manufacturing steps of a piezoelectric element of the related art.

In the embodiment, the metal film 16 is provided between the piezoelectric film 14 and the resist film 18, and the piezoelectric film 14 is wet-etched by using the metal film 16 as a mask material. FIG. 3 is a diagram showing an etching step of a piezoelectric film of the related art. In the related art, a lower electrode 212 and a piezoelectric film 214 are formed on a substrate 210 ((A) of FIG. 3), and a patterned resist film 218 is formed on the piezoelectric film 214 ((B) of FIG. 3). The piezoelectric film 214 is wet-etched by using the resist film 218 as a mask material ((C) of FIG. 3). Then, by peeling off the resist film 218, the piezoelectric film 214 is etched ((D) of FIG. 3).

The thermal expansion coefficient of an oxide material such as a PZT film is low at 10 ppm/° C. or lower, and the thermal expansion coefficient of an organic material such as a resist film is high at 50 ppm/° C. to several hundreds of ppm/° C. Accordingly, when a resist film is formed on a PZT film as in the case of the etching method of the related art, stress is generated due to a small difference in temperature. Therefore, the adhesion is poor, and peeling is likely to occur. When the adhesion is poor, an etchant penetrates into an interface between the piezoelectric film and the resist film during etching, side etching progresses, and the piezoelectric film becomes tapered.

On the other hand, in the embodiment, the metal film 16 is provided on the piezoelectric film 14, and the thermal expansion coefficient of the metal material for forming the metal film 16 is 20 ppm/° C. or lower. Therefore, a difference in thermal expansion coefficient between the piezoelectric film 14 and the metal film 16 as a mask material can be reduced. Accordingly, the peeling of the piezoelectric film 14 and the mask material can be prevented. Therefore, during wet etching, side etching can be prevented, and a pattern can be formed with high accuracy.

In addition, during the wet etching of the metal film 16, there may be a problem in the adhesion of the interface between the metal film 16 and the resist film 18 as a mask material. However, in the embodiment, the thickness of the metal film 16 is small at 20 nm to 300 nm Therefore, the etching time can be reduced. Accordingly, the progress of side etching in the metal film 16 can be suppressed. When the thickness of the metal film 16 is large, the etching time increases, and thus the resist film 18 is peeled off from the interface between the metal film 16 and the resist film 18. As a result, a large amount of side etching occurs in the metal film 16. Therefore, the metal film 16 cannot be etched with high pattern accuracy. Accordingly, the pattern accuracy of the piezoelectric film 14 also decreases.

Therefore, in the metal film 16, it is preferable that the etching time is as short as possible. That is, the etchant for etching the metal film 16 and the etchant for etching the piezoelectric film 14 are different from each other, the metal film 16 has resistance to the etchant for etching the piezoelectric film 14, the piezoelectric film 14 has resistance to the etchant for etching the metal film 16, and the metal film 16 and the piezoelectric film 14 do not infiltrate into each other. In this case, as the thickness of the metal film 16 decreases, etching can be performed within a short period of time. Therefore, the peeling of the resist interface is small, and ideal etching can be performed.

When the thickness of the metal film 16 is 10 nm or less, a film cannot be sufficiently formed and becomes an island shape, and there is an adverse effect during the etching of the piezoelectric film 14, which is not preferable. In consideration of robustness, the thickness of the metal film 16 is preferably 20 nm or more. On the other hand, when the thickness of the metal film 16 is large, side etching progresses. Therefore, the thickness of the metal film 16 is preferably 300 nm or less and more preferably 200 nm or less.

Second Embodiment

In the first embodiment, the resist film and the metal film are peeled off after the etching of the piezoelectric film, and then the upper electrode is formed, thereby forming a piezoelectric element. However, a second embodiment is different from the first embodiment, in that the metal film is used as the upper electrode after the resist film is peeled off, thereby forming a piezoelectric element.

The second embodiment can be performed using the same method as in (Step 1): substrate preparation step to (Step 8): resist film removing step of the first embodiment. In addition, since the metal film 16 functions as an upper electrode, a NiCr alloy, Ni, Cr, Cu, or Au can be used as the material of the metal film.

Figure 4:
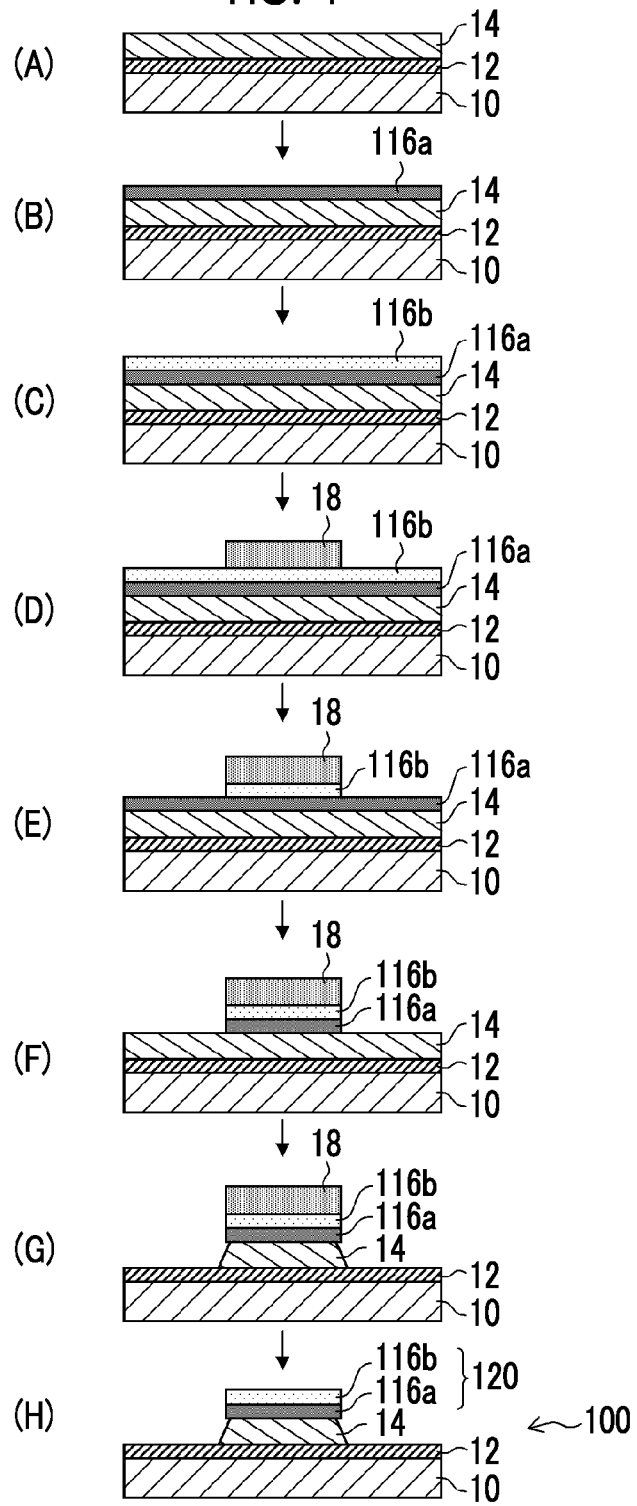
FIG. 4 is a diagram showing manufacturing steps of a piezoelectric element according to a second embodiment.

In addition, when the upper electrode includes two or more metal films, the respective metal films can be individually formed and etched to manufacture a piezoelectric element. FIG. 4 is a diagram showing a method for manufacturing a piezoelectric element according to the second embodiment when the upper electrode includes two layers.

Until the formation of the piezoelectric film 14, the manufacturing steps according to the second embodiment are performed using the same method as in the first embodiment ((A) of FIG. 4). After the formation of the piezoelectric film 14, a first metal film 116*a* is formed ((B) of FIG. 4). Next, a second metal film 116*b* is formed on the first metal film 116*a* ((C) of FIG. 4). A method for forming the first metal film 116*a* and the second metal film 116*b* is the same as in the first embodiment. As the first metal film 116*a*, for example, a NiCr film having a thickness of 20 nm is formed. As the second metal film 116*b*, for example, a Au film having a thickness of 300 nm can be formed.

Next, the resist film 18 on which a pattern is formed is formed on the second metal film 116*b* ((D) of FIG. 4). A method for forming the resist film 18 is the same as in the first embodiment.

Next, the second metal film 116*b* is wet-etched ((E) of FIG. 4). As an etchant used for the etching of the second metal film 116*b*, an etchant, which etches the second metal film 116*b* and has etching resistance to the first metal film 116*a* and the piezoelectric film 14, is used. For example, a Au film is etched using an iodine-based etchant.

Next, after the etching of the second metal film 116*b*, the first metal film 116*a* is wet-etched ((F) of FIG. 4). As an etchant used for the etching of the first metal film 116*a*, an etchant, which etches the first metal film 116*a* and has etching resistance to the second metal film 116*b* and the piezoelectric film 14, is used. For example, a NiCr film is etched using a ceric ammonium nitrate-based etchant. In this way, when two or three or more metal films are formed, it is necessary that each of the metal films is etched using an optimum etchant.

Next, the piezoelectric film 14 is etched ((G) of FIG. 4). A method for etching the piezoelectric film 14 is the same as in the first embodiment. Finally, the resist film 18 is peeled off using a specific peeling solution ((H) of FIG. 4). As a result, a piezoelectric element 100 including an upper electrode 120 is formed.

In the method for manufacturing a piezoelectric element (method for etching a piezoelectric film) shown in FIG. 4, the first metal film 116*a* and the second metal film 116*b* are provided on the piezoelectric film 14. Therefore, side etching can be suppressed during the etching of the piezoelectric film 14. In addition, since the thicknesses of the first metal film 116*a* and the second metal film 116*b* are small, side etching can be suppressed in the first metal film 116*a* and the second metal film 116*b*. Therefore, the first metal film 116*a* and the second metal film 116*b* can be wet-etched with high pattern accuracy. Accordingly, the piezoelectric film 14 can also be wet-etched with high pattern accuracy.

In addition, the first metal film 116*a* and the second metal film 116*b*, which are used as a mask material during the etching of the piezoelectric film 14, can be used as an upper electrode. Therefore, a step of peeling a mask material and a step of forming an upper electrode are not necessary.

When the upper electrode 120 includes two layers, one layer can be efficiently used as a mask material of the piezoelectric film 14, and the other layer can be efficiently used as a conductive layer.

EXAMPLES

The present invention will be described in more detail using the following Examples.

Test Example 1

Example 1

A Ti adhesion layer (10 nm) was formed on a six-inch Si wafer, and an Ir layer having a thickness of 150 nm was formed thereon to obtain a lower electrode. Next, a PZT film (2 µm) doped with Nb was formed. Next, a NiCr film having a thickness of about 200 nm was formed on the entire surface of the PZT film using a sputtering method. "TSMR 8900" (product name, manufactured by Tokyo Ohka Kogyo Co., Ltd.) having a thickness of about 1.5 µm as a resist was formed on the NiCr film and was patterned with a line width of about 40 µm.

The NiCr film as a metal film was etched with an etchant containing ceric ammonium nitrate as a major component. The etching was performed at a liquid temperature of 25° C. using an impregnation method. After the etching, the PZT film was not deformed at all, and the etching of the PZT film was not observed.

Next, the PZT film was etched at room temperature with a mixed liquid containing 0.29% of ammonium hydrogen fluoride ($NH_4F \cdot HF$), 1.2% of ammonium fluoride ($NH_4F$), 28% of nitric acid ($HNO_3$), 17% of acetic acid ($CH_3COOH$), and 53% of water. The etching was performed by dipping the PZT film in a bath filled with the etchant for 3 minutes and sufficiently washing the PZT film with flowing water. After the etching, the NiCr film was not impregnated with the etchant.

Next, the resist film was peeled off using the peeling solution "ST-120" (product name; manufactured by Tokyo Ohka Kogyo Co., Ltd.).

Next, a residue of the NiCr film was etched with the etchant containing ceric ammonium nitrate as a major component. The etching was performed at a liquid temperature of 5° C. using an impregnation method. As a result, the PZT film can be patterned.

<Result>

Figure 6:
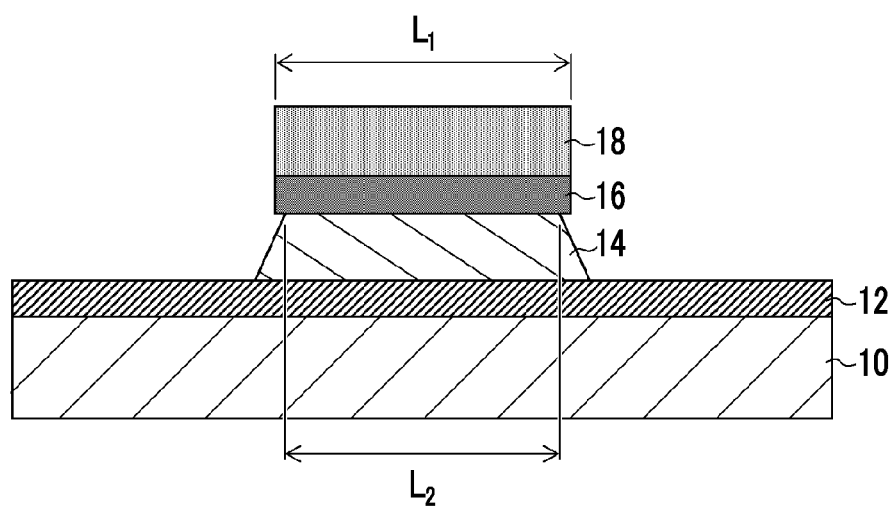
FIG. 6 is a diagram showing the amount of side etching.

The line width of the formed piezoelectric film and the line width of the resist were measured at five points in total including the center of the wafer surface and four peripheral points (front, back, left, right) on the surface. The results are shown in FIG. 5. The measurement points were positions of (1) center, (2) front, (3) back, (4) left, and (5) right. In addition, as shown in FIG. 6, the amount of side etching was defined as a value obtained by subtracting the width $L_2$ of the uppermost portion of the piezoelectric film 14 after etching from the width $L_1$ of the resist film 18 after the pattern formation. In Example 1, the average of the values measured at the five points was 1.76 µm, and a favorable pattern was able to be formed.

Comparative Example 1

In Comparative Example 1, a metal film was not formed on the piezoelectric film, and the piezoelectric film was wet-etched by using the resist film as a mask material.

A Ti adhesion layer (10 nm) was formed on a six-inch Si wafer, and an Ir layer having a thickness of 150 nm was formed thereon to obtain a lower electrode. Next, a PZT film (2 µm) doped with Nb was formed. "TSMR 8900" (product name, manufactured by Tokyo Ohka Kogyo Co., Ltd.) having a thickness of about 1.5 µm as a resist was formed on the PZT film and was patterned with a line width of about 40 µm.

Next, the PZT film was etched at room temperature with a mixed liquid containing 0.29% of ammonium hydrogen fluoride ($NH_4F \cdot HF$), 1.2% of ammonium fluoride ($NH_4F$), 28% of nitric acid ($HNO_3$), 17% of acetic acid ($CH_3COOH$), and 53% of water. The etching was performed by dipping the PZT film in a bath filled with the etchant for 3 minutes and sufficiently washing the PZT film with flowing water.

Next, the resist film was peeled off using the peeling solution "ST-120" (product name; manufactured by Tokyo Ohka Kogyo Co., Ltd.). As a result, the PZT film can be patterned.

<Result>

Using the same method as in Example 1, the line width of the formed piezoelectric film and the line width of the resist were measured at five points (center, front, back, left, right) in the wafer surface. The results are shown in FIG. 7. In Comparative Example 1, the average of the amounts of side etching measured at the five points was about 15 µm, and the amount of side etching was large.

Test Example 2

Examples 2 to 7

Comparative Examples 2 and 3

In Examples 2 to 7 and Comparative Examples 2 and 3, the piezoelectric film was etched while changing the metal film, the etchant for etching the metal film, and the material for forming the piezoelectric film. The thickness of the metal film was 200 nm. The results are shown in FIG. 8. The evaluation in FIG. 8 was determined based on the following criteria. In addition, "Hydrofluoric Acid-Based" etchant in FIG. 8 was used for the etching of the piezoelectric film in Example 1.

A . . . Substantially no side etching occurred, and the value thereof was less than 2 µm B . . . A small amount of side etching occurred (2 µm or more and less than 5 µm), but there was no problem C . . . Side etching occurred (5 µm or more)

In Example 2, etching was performed using the same method as in Example 1, except that $BaTiO_3$ was used as the material of the piezoelectric film. A favorable piezoelectric film in which side etching was suppressed was able to be obtained.

In Examples 3 to 7, etching was performed using the same method as in Example 1, except that the metal film and the etchant for etching the metal film were changed as shown in FIG. 8. In Examples 3 to 7, favorable piezoelectric films in which side etching was suppressed were also able to be obtained.

In the etching of Comparative Example 2, a $TiO_2$ film was used as the metal film; and the hydrofluoric acid-based etchant used for the etching of the PZT film in Example 1 was used as an etchant of the $TiO_2$ film. When the metal film was etched, the PZT film was also etched together with the metal film. Therefore, the side etching of the PZT film progressed.

In the etching of Comparative Example 3, a NiCr film was used as the metal film; and the hydrofluoric acid-based etchant used for the etching of the PZT film in Example 1 was used as an etchant of the NiCr film. With the hydrofluoric acid-based etchant, the NiCr film was not etched, and the piezoelectric film was not able to be etched.

It can be seen from the above results that the piezoelectric film can be favorably patterned by optimizing the etchant used for the etching of the metal film.

Test Example 3

Examples 8 to 10

Comparative Examples 4 and 5

In Test Example 3, the thickness of the metal film was changed, and then the piezoelectric film was etched. The piezoelectric film was etched using the same method as in Example 1, except that the thickness of the metal film was changed as shown in FIG. 9; and the thickness of the piezoelectric film was changed to 3 μm. The results are shown in FIG. 9. The evaluation in FIG. 9 was performed based on the same criteria as in Test Example 2.

As shown in FIG. 9, in Comparative Example 4 in which the thickness of the metal film was 10 nm, the NiCr film was not able to function sufficiently as a mask material, and during the etching of the piezoelectric film, the etching of the piezoelectric film progressed at a lower portion of the NiCr film. In addition, in Comparative Example 5 in which the thickness of the metal film was 400 nm, the metal film was thick; therefore, a long period of time was required for the etching of the metal film, and the metal film was over-etched. Therefore, the pattern accuracy of the piezoelectric film also decreased.

In Examples 8 and 9 in which the thicknesses of the metal films were 20 nm and 200 nm, respectively, the side etching of the metal film did not progress, and the piezoelectric film was able to be favorably patterned. In Example 10 in which the thickness of the metal film was 300 nm, a long period of time was required for the etching of the metal film due to the large thickness of the metal film, and a small amount of side etching occurred; however, there was no problem in the formed piezoelectric film.

It can be seen from the above results that the thickness of the metal film is preferably 20 nm to 300 nm and more preferably 20 nm to 200 nm.

EXPLANATION OF REFERENCES 1, 100: piezoelectric element
10, 210: substrate
12, 212: lower electrode
14, 214: piezoelectric film
16: metal film
18, 218: resist film
20, 120: upper electrode
116a: first metal film
116b: second metal film

What is claimed is:

1. A method for manufacturing a piezoelectric element, comprising:
   a lower electrode forming step of forming a lower electrode on a substrate;
   a piezoelectric film forming step of forming a piezoelectric film on the lower electrode;
   a metal film forming step of forming a metal film having a thickness of 20 nm to 300 nm on the piezoelectric film;
   a resist film forming step of forming a resist film on the metal film and patterning the resist film;
   a metal film etching step of etching the metal film with a first etchant by using the resist film as a mask material;
   a piezoelectric film etching step of etching the piezoelectric film with a second etchant by using the metal film after the metal film etching step as a mask material;
   a resist film removing step of removing the resist film after the piezoelectric film etching step;
   a metal film removing step of removing the metal film after the resist film removing step; and
   an upper electrode forming step of forming an upper electrode on the piezoelectric film from which the metal film has been removed in the metal film removing step, wherein:
   the metal film is made of a material containing one of Fe, Cr, NiCr, SUS, Al, Cu, and Au;
   as the first etchant, an etchant to which the piezoelectric film has etching resistance is used, and the first etchant contains one of ferric chloride, sulfuric acid, ammonium persulfate, a mixed liquid of iodine and alkali iodide, ceric ammonium nitrate, a mixed liquid of hydrogen peroxide solution and phosphoric acid, nitric acid, and potassium hydroxide; and
   as the second etchant, an etchant to which the metal film has etching resistance is used.

2. The method as defined in claim 1, wherein the metal film contains oxygen or nitrogen.

3. The method as defined in claim 1, wherein the second etchant is a hydrofluoric acid-based etchant.

4. The method as defined in claim 1, wherein:
   two or more of the metal films are formed,
   in the metal film etching step, different etchants are used for the respective the metal films as the first etchant, and
   each of the etchants which are used as the first etchant etches one of the metal films and any other one of the metal films has etching resistance thereto.

5. The method as defined in claim 1, wherein the piezoelectric film is made of an oxide material.

6. The method as defined in claim 5, wherein the piezoelectric film has a perovskite structure containing Pb.

7. The method as defined in claim 5, wherein the piezoelectric film is represented by the following Formula (P):

$$A_a B_b O_3 \qquad (P)$$

where A represents an A-site element which contains at least one element containing Pb as a major component,
B represents a B-site element which contains at least one element selected from the group consisting of Ti, Zr, V, Nb, Ta, Cr, Mo, W, Mn, Sc, Co, Cu, In, Sn, Ga, Zn, Cd, Fe, and Ni,
O represents oxygen, and
although a=1.0 and b=1.0 is standard, numerical values of a and b may deviate from 1.0 within a range where a perovskite structure can be adopted.

* * * * *